United States Patent
Kopalidis et al.

(10) Patent No.: US 8,890,506 B2
(45) Date of Patent: *Nov. 18, 2014

(54) APPARATUS AND METHOD FOR MEASURING ION BEAM CURRENT

(75) Inventors: Peter M. Kopalidis, Fremont, CA (US); Zhimin Wan, Sunnyvale, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 563 days.

This patent is subject to a terminal disclaimer.

(21) Appl. No.: 13/227,425

(22) Filed: Sep. 7, 2011

(65) Prior Publication Data

US 2013/0057250 A1 Mar. 7, 2013

(51) Int. Cl.
*G01N 27/00* (2006.01)
*G01R 19/00* (2006.01)
*G01N 27/62* (2006.01)

(52) U.S. Cl.
CPC ............ *G01N 27/62* (2013.01); *G01R 19/0061* (2013.01)
USPC ........................................ 324/71.3

(58) Field of Classification Search
None
See application file for complete search history.

(56) References Cited

U.S. PATENT DOCUMENTS

| | | | |
|---|---|---|---|
| 2002/0070347 A1* | 6/2002 | Bisson et al. ............. | 250/423 R |
| 2003/0222227 A1 | 12/2003 | Richards et al. | |
| 2004/0262532 A1* | 12/2004 | Krueger ........................ | 250/397 |
| 2008/0142727 A1* | 6/2008 | Ryding et al. ................ | 250/400 |
| 2011/0042578 A1* | 2/2011 | Murrell et al. ................ | 250/397 |

FOREIGN PATENT DOCUMENTS

| | | | |
|---|---|---|---|
| JP | 404171837 A | * | 6/1992 |
| KR | 2007075932 A | * | 7/2007 |

OTHER PUBLICATIONS

U.S. Appl. No. 12/841,833, filed Jul. 22, 2010.

* cited by examiner

*Primary Examiner* — Melissa Koval
*Assistant Examiner* — Daniel Miller
(74) *Attorney, Agent, or Firm* — Donald E. Stout; Stout, Uxa & Buyan, LLP

(57) ABSTRACT

Techniques for measuring ion beam current, especially for measuring low energy ion beam current, are disclosed. The technique may be realized as an ion beam current measurement apparatus having at least a planar Faraday cup and a voltage assembly. The planar Faraday cup is located close to an inner surface of a chamber wall, and intersects an ion beam path. The voltage assembly is located outside a chamber having the chamber wall. Therefore, by properly adjusting the electric voltage applied on the planar Faraday cup by the voltage assembly, some undesired charged particles may be adequately suppressed. Further, the planar Faraday cup may surround an opening of a non-planar Faraday cup which may be any conventional Faraday cup. Therefore, the whole ion beam may be received and measured well by the larger cross-section area of the planar Faraday cup on the ion beam path.

18 Claims, 9 Drawing Sheets

APPARATUS AND METHOD FOR MEASURING ION BEAM CURRENT

BACKGROUND OF THE INVENTION

1. Field of the Invention

The present disclosure relates generally to ion implantation and more particularly to techniques for measuring ion beam current.

2. Description of Related Art

Ion implanters are commonly used in the production of semiconductor devices, flat panels, solar cells and so on. An ion source is used to generate a charged ion beam, which is then analyzed by a mass analyzer to remove ions with undesired charge-to-mass ratios and then directed toward a workpiece, such as a semiconductor wafer or a glass plate, held by a holder. One or more devices may be located between the mass analyzer and the holder for adjusting the ion beam by applying an electric field, a magnetic field and/or other approach. These devices, such as collimator and acceleration/deceleration electrodes, are usually viewed as a portion of the "beam optics". To monitor the ion beam current, which is significantly related to the dosage in the implanted workpiece, a Faraday cup is commonly used to receive and measure the ion beam. Usually, the Faraday cup is a deep structure that extends into a chamber wall and has an opening that faces a workpiece position where a workpiece held by the holder is located. By moving one or more of the holder and the ion beam, the ion beam may be directed toward the Faraday cup and then be measured correspondingly.

FIG. 1 is a representative schematic diagram of the configuration of the conventional Faraday cup. An ion beam 12 from the mass analyzer (not shown) is directed from the left side of a chamber 11 to a Faraday cup 13, which is located on the right side of the chamber 11 and is a deep structure that extends into a chamber wall of the chamber 11. The Faraday cup 13 has an opening facing an inner space of the chamber 11, such as a workpiece position where a workpiece to be implanted is located. Clearly, when the ion beam 12 is projected into the Faraday cup 13, the charges of these ions in the ion beam 12 will be measured by a current meter 14 electrically coupled with the Faraday cup 13. In addition, a separate set of magnets may be located close to the Faraday cup 13 for adequately suppressing secondary electrons, incoming electrons and low energy ions, so that the current measured by the current meter 14 is accurately equal to the current of the charges delivered by the ion beam 12.

However, there are some practical problems. First, the ion beam 12 from the mass analyzer, or through the beam optics, may be misaligned. Then, the ion beam 12 may be not totally projected into the Faraday cup 13. Second, owing to space charge effects, the expansion of the ion beam 12 is inevitable. The beam expansion is more serious for a low energy ion beam, because the slower ion velocity results in longer travel time from the mass analyzer to the Faraday cup 13. Then, especially for the low energy ion beam, the ion beam 12 tends to be tall and wide and then a significant percentage of the total beam current is at the edges. Hence, when the ion beam is not totally received by the Faraday cup 13, the accuracy of the ion beam measurement is further degraded. Third, with the popularity of larger-size workpieces, such as 12-inch wafers, there is a tendency toward taller ion beams. Clearly, when the size of the entrance of the Faraday cup 13 is limited, the taller beams present a risk of projecting part of the ion beam 12 outside the Faraday cup 13.

A popular approach to achieve accurate dose control is to use a profiler to measure the ion beam 12. Hence, by using the acquired beam current distribution of the ion beam 12, the current measured by the Faraday cup 13 may be corrected. However, the hardware cost and the operation of the profiler will increase the total cost and decrease the throughput. Another popular approach is directly increasing the size of the entrance of the Faraday cup 13 for increasing the cross-section area capable of receiving the ion beam. However, much hardware exists on the chamber wall of the chamber 11, for example, the gas pipeline connected to the vacuum pump for pumping, the power line for powering the beam optics or the devices for moving the holder, and the window for moving the workpiece in and out of the chamber 11. Hence, the size of the conventional Faraday cup, especially the size of the opening of the conventional Faraday cup, cannot be arbitrarily enlarged.

A recent approach is U.S. patent application Ser. No. 12/841,833 to Peter M. Kopalidis, filed Jul. 22, 2010, incorporated herein by reference. In this approach, a planar Faraday cup is disposed on the inner surface of the chamber wall and optionally around the conventional Faraday cup which is a deep structure as described above, and a magnet is positioned close to the planar Faraday cup so that at least some kinds of undesired charged particles are suppressed by the magnetic field generated by the magnet. In this way, the effective area to receive the ion beam is increased, and the inaccuracy induced by the undesired charged particles (such as incoming electrons, secondary electrons and slow ions) can be improved. However, this approach is still not perfect. For example, the existence of the magnet unavoidably increases the hardware cost and the size of the chamber.

Accordingly, a novel and efficient approach for the above issue is desired.

SUMMARY OF THE INVENTION

In order to solve the foregoing problems, this invention proposes a method and an apparatus for measuring the ion beam current.

One exemplary embodiment is an ion beam current measurement apparatus having at least a planar Faraday cup and a voltage assembly. The planar Faraday cup is located close or adjacent to an inner surface of a chamber wall, and may be a plate-like structure non-parallel to or parallel to the inner surface. The voltage assembly is electrically coupled with the planar Faraday cup and is used to apply electric voltage to the planar Faraday cup. Optionally, the planar Faraday cup may surround an opening of an additional non-planar Faraday cup which may be any conventional Faraday cup. Therefore, due to at least the larger cross-section area of the planar Faraday cup on the ion beam path, the measured portions of the ion beam may be further increased. Also, due to the electric field generated by the electric voltage applied on the planar Faraday cup, at least the incoming electrons can be partially suppressed so that the measurement accuracy may be further increased.

Another exemplary embodiment is a method for measuring the ion beam current. Initially, prepare an ion beam current measurement apparatus in an ion implanter. As disclosed above, the ion beam current measurement apparatus has at least a planar Faraday cup and a voltage assembly, and may further have non-planar Faraday cup. Then, monitor the ion beam current received by the planar Faraday cup, even by the non-planar Faraday cup. Of course, the method may further adjust the voltage assembly for generating different electric fields being suitable for measuring different ion beams having different sizes, different shapes or other different characteristics.

The forgoing and other features of the invention will be apparent from the following more detailed description of embodiments of the invention.

DETAILED DESCRIPTION OF THE INVENTION

The detailed description of the present invention will be discussed in the following embodiments, which are not intended to limit the scope of the present invention, and can be adapted for other applications. While drawings are illustrated with some details, it is appreciated that the quantity of the disclosed components may be greater or less than that disclosed, except when expressly restricting the amount of the components.

One conventional technique uses the conventional Faraday cup being a deep structure in the chamber wall and having limited cross-section area of the conventional Faraday cup on a plane intersecting the ion beam path. Hence, partial ion beam may be not received and measured by the conventional Faraday cup, especially when the deflect angle and/or the beam size of the ion beam is larger. Another conventional technique uses the profiler and then results in inevitably an extra device (profiler) and an extra step (measuring ion beam by the profiler and using the measured result to modify the measured result of the Faraday cup). Moreover, the profiler may be not closed enough to the entrance of the opening of the Faraday cup, so that the accuracy of the measurement is decreased. One more conventional technique uses both planar Faraday cup and magnet positioned close to the planar Faraday cup. Clearly, the measured area is increased by the planar Faraday cup and some desired charged particles are pushed away by the magnetic field generated by the magnet. However, the existence of the magnet inevitably increases the hardware cost and the mechanical complexity.

Accordingly, these conventional techniques cannot balance the requirements of accuracy and efficiency well.

One starting point of the invention is to directly receive and measure whole the ion beam, i.e., to directly use the Faraday cup. In other words, the profiler is only an option at most for measuring the ion beam current distribution or other messages related to the ion beam. However, as briefly described above, the size of the opening of the conventional Faraday cup usually is finite and has a clear upper limitation due to the practical design requirements of the chamber (or chamber wall). Therefore, the invention proposes a novel design of an ion beam current measurement apparatus (or viewed as novel Faraday cup). Moreover, to increase the measurement accuracy, the proposed ion beam current measurement apparatus should be able to prevent some undesired charged particles from being received/measured, for example, the incoming electrons delivered with the ion beam, which is used to neutralize the ion beam to be implanted into a workpiece.

Figure 1:
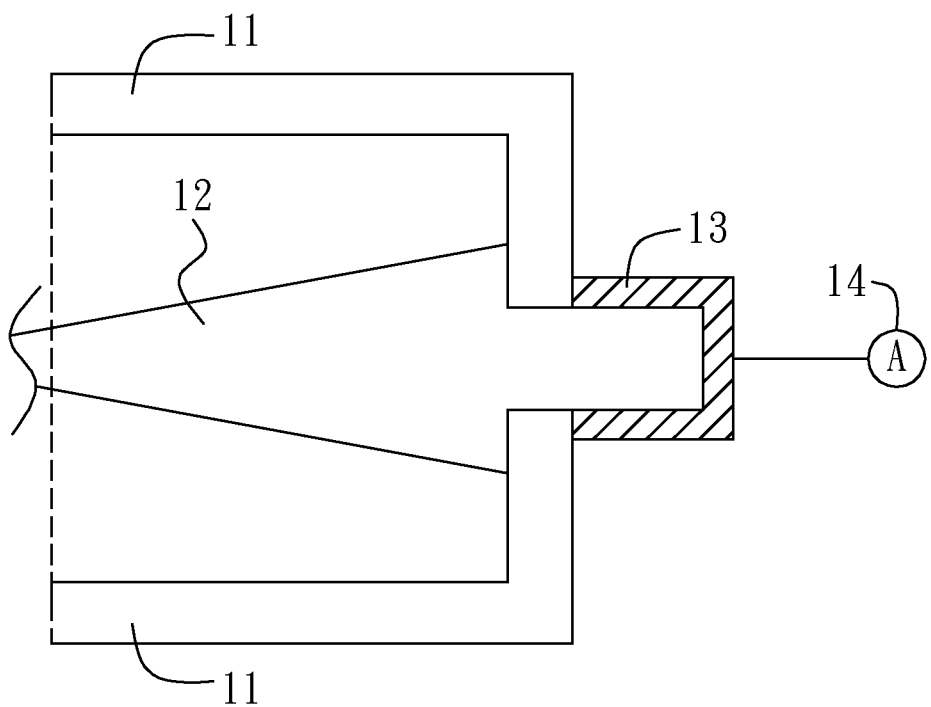
FIG. 1 is a representative schematic diagram of the configuration of the conventional Faraday cup.
Figure 2A:
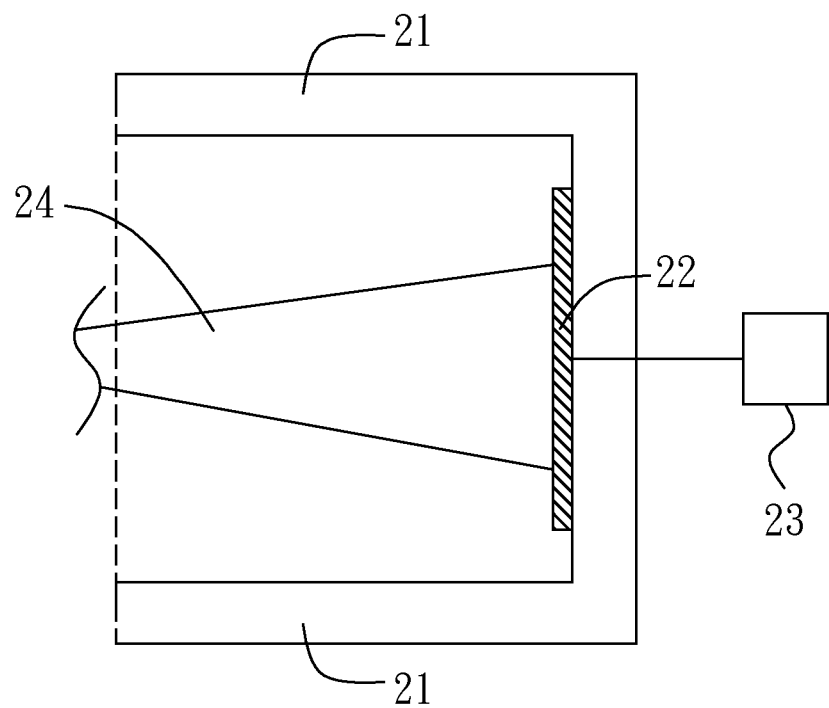
FIG. 2A and FIG. 2B are two representative schematic diagrams of one proposed ion beam current measurement apparatus according to one embodiment of the invention.
Figure 2B:
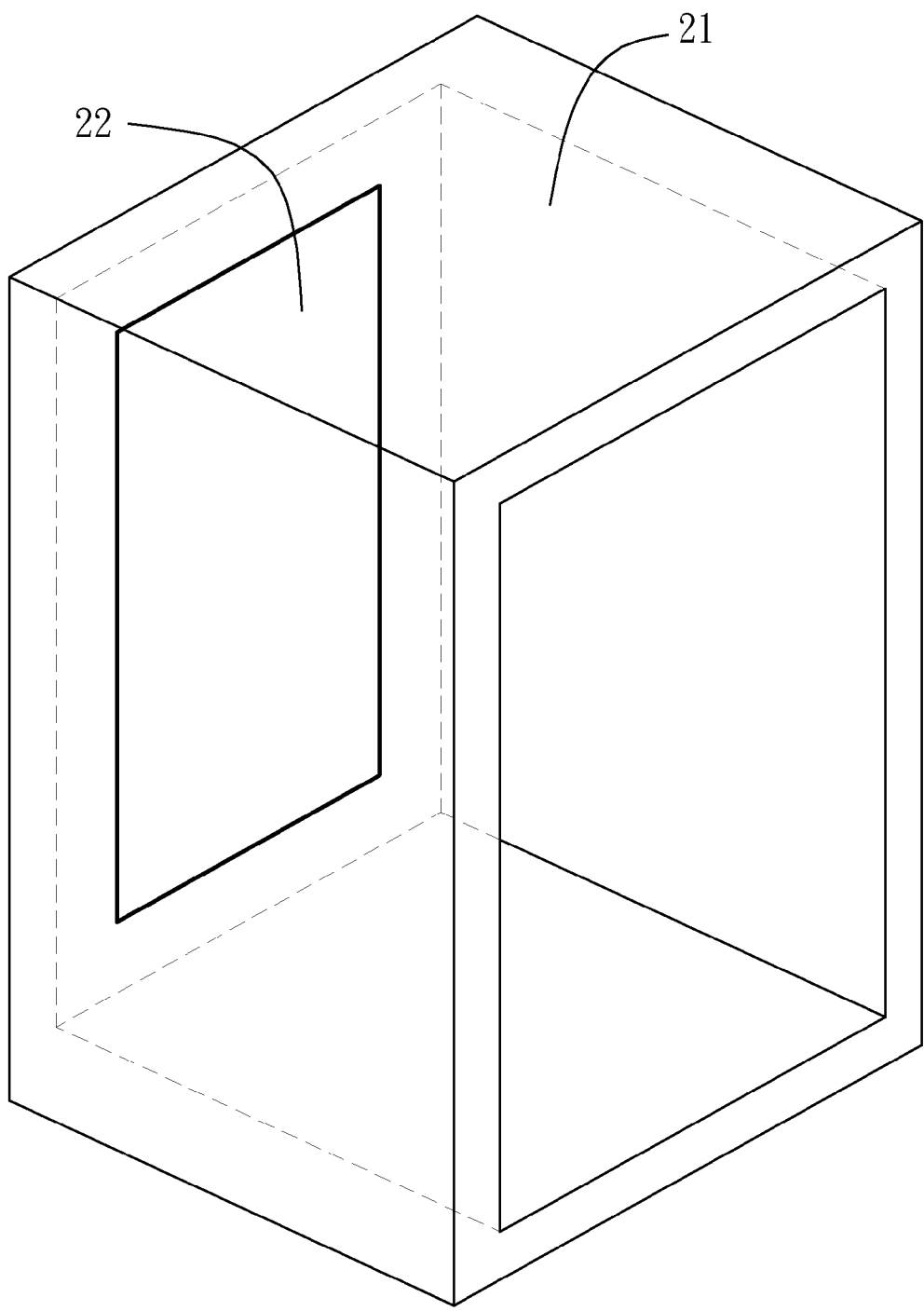

One embodiment is an ion beam current measurement apparatus with two representative schematic diagrams, FIG. 2A and FIG. 2B. The proposed ion beam current measurement apparatus is located close or adjacent to a portion of a chamber wall of a chamber 21. An ion beam 24 is directed to implant a workpiece when the workpiece is located inside the chamber 21. The workpiece may be a wafer, a semiconductor plate, a glass plate or any plate whose surface quality may be changed by implanted ions. The proposed ion beam current measurement apparatus has at least a planar Faraday cup 22 and a voltage assembly 23. In short, the planar Faraday cup 22 is close or adjacent to an inner surface of the chamber wall, and faces an inner space of the chamber 21. The voltage assembly 23 is electrically coupled with the planar Faraday cup 22 and is used to apply electric voltage to the planar Faraday cup 22.

Reasonably, the planar Faraday cup 22 is essentially positioned on a plane across the ion beam path. For example, when the ion beam path is vertical to the inner surface of the chamber wall, the planar Faraday cup 22 may be positioned on the inner surface of the chamber wall or may be a three dimensional structure around the intersection between the ion beam path and the chamber wall. In other words, the planar Faraday cup 22 may have non-zero angle with respect to inner surface of the chamber wall, or the planar Faraday cup 22 may be at least parallel to, even absolutely parallel to, the inner surface of the chamber wall. Accordingly, the cross-section area of the ion beam current measurement apparatus on the ion beam path is significantly increased. Particularly, in general, most of hardware is located outside the chamber (or attached on the outer surface of the chamber wall) for minimizing potential contamination inside the chamber. Therefore, the planar Faraday cup inside the chamber usually may be extended with less limitation (less risk of being overlapped and/or blocked with other hardware inside the chamber). Accordingly, the available surface size limitation on the planar Faraday cup may be significantly larger than the limitation on the opening of the conventional Faraday cup. Hence, the measured portions of the ion beam 24 may be significantly high, even whole the ion beam 24 may be totally received by the planar Faraday cup 22, no matter how large the deflect angle and/or the beam size of the ion beam is.

The planar Faraday cup 22 usually is configured according to at least one of the following requirements: (a) covers essentially an entire area around the intersection between the ion beam current direction and the chamber wall without any gap; and (b) be extended along a direction across the ion beam path with an extended distance being inversely proportional to a predetermined limitation of an ion beam energy. The former requirement can minimize the loss of at least a portion of an ion beam (not received and measured), especially the middle portion of the ion beam. The latter requirement can minimize the loss of a portion of an ion beam which has a larger deflected angle and/or a larger beam size (such as a longer beam height), especially to minimize the loss of the two terminal portions of the ion beam.

Figure 2C:
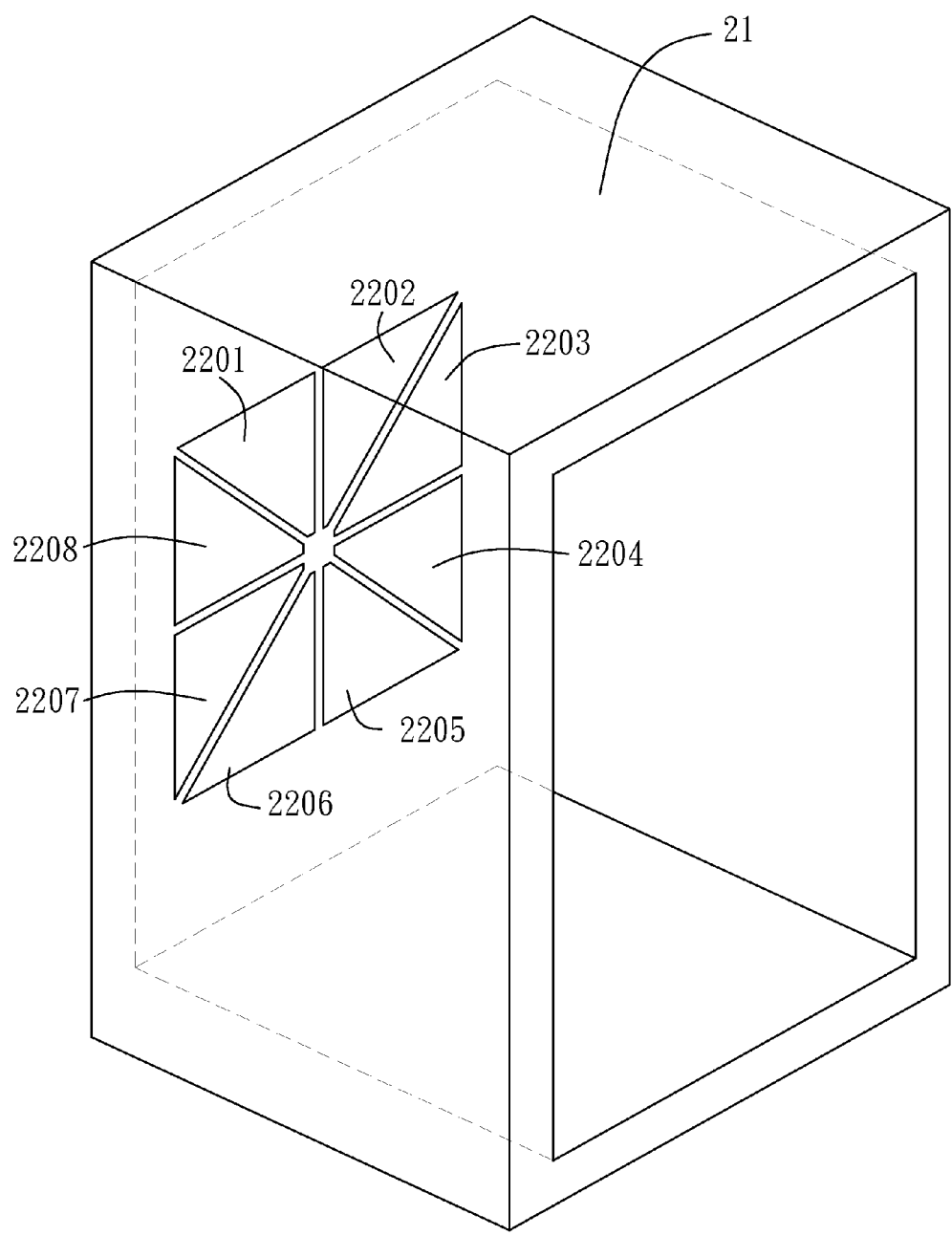
FIG. 2C is a representative schematic diagram of one proposed planar Faraday cup according another embodiment of the invention.
Figure 2D:
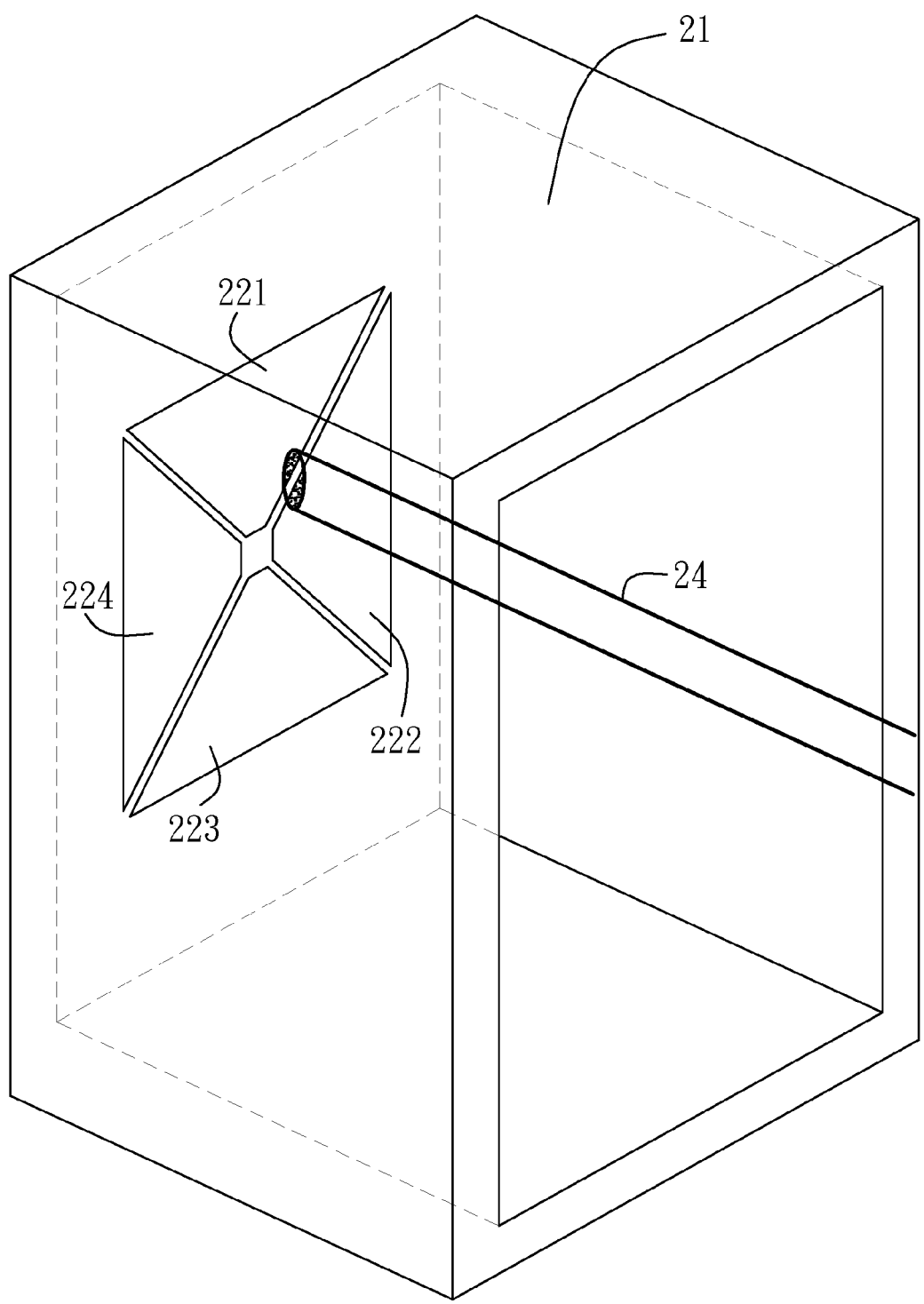
FIG. 2D is a representative schematic diagram of one proposed ion beam current measurement apparatus according to another embodiment of the invention.

Note that the details of how to configure the planar Faraday cup 22 are not limited. Different embodiments may have different variations. For example, to properly receive and measure the ion beam, the planar Faraday cup may consist of one or more conductive plates. As the embodiment shown in FIG. 2C, the planar Faraday cup 22 has eight long/wide conductive plates 2201-2208. Herein, each conductive plate is electrically insulated from other conductive plates. Hence, by separately measuring the individual ion beam current appearing on different conductive plates, how the ion beam 24 is deflected and/or dispersed may be properly monitored. For example, in the case shown in FIG. 2D, when the ion beam 24 is essentially projected onto the top and right corners of the ion beam current measurement device, the individual ion beam current is highest on the top conductive plate 221, middle on the right conductive plate 222, and zero on the left and bottom conductive plates 223/224. Hence, in addition to the total ion beam current measurement, the embodiment can also acquire information on the beam position by separating the four conductive plates 221/222/223/224 so that instant signals may be provided to control the beam position and the beam angle during automatic ion beam tuning. Reasonably, when the ion beam current measurement apparatus is formed by one and only one conductive plate may, only the total amount of ion beam current may be measurement. In contrast, when the ion beam current measurement apparatus is formed by two or more conductive plates, how the total amount of the ion beam current is distributed on a plane crossing the ion beam path can be measured. In other non-illustrated embodiments, each of the number, the shape, the size and the position (even other parameters) of these conductive plates is adjustable.

Of course, to meet the above requirement (a), the area occupied by the electrical insulator used to insulate electrically different conductive plates should be minimized. Moreover, to minimize potential contamination induced by the collision between the ion beam (even other particle, such as gas) and the conductive plates, the material of a surface of the planar Faraday cup 22 usually is graphite. However, it also may be conductive glue, conductive film, or other conductive material.

On the other hand, the voltage assembly 23 is designed to apply electric voltage on the planar Faraday cup 22. Hence, the planar Faraday cup 22 generates an electric field in the inner space inside the chamber, and then some undesired charged particles can be suppressed and not received/measured. For example, due to at least the plasma shower for ion beam neutralization, numerous incoming electrons will be incorporated with the ion beam. Clearly, these incoming electrons received and measured by the planar Faraday cup 22 will generate a current which is opposite to the current generated by the received and measured ions. Therefore, the net current measured by the beam current measurement apparatus will be different than the practical ion beam current. However, when a negative electric voltage is applied on the planar Faraday cup 22, the planar Faraday cup 22 can generate an electric field in the inner space so that these incoming electrons can be suppressed accordingly. Furthermore, the proposed invention does not limit whether a negative electric voltage or a positive electric voltage is applied on the planar Faraday cup 22. In other words, when a positive electric voltage is applied on the planar Faraday cup 22, the planar Faraday cup 22 can generate another electric filed in the inner space for minimizing the secondary electrons emitted away from the planar Faraday cup.

What kind of electric voltage is applied is decided by what kind of undesired charged particles to be suppressed. To suppress the incoming electrons delivered with the ion beam, a negative electric voltage should be applied to prevent the incoming electrons from being collected by the planar Faraday cup 22. In contrast, to suppress the secondary electrons, even the slow ions in the ion beam, a positive electric voltage should be applied to minimize the current induced by the secondary electrons and/or the slow ions. Furthermore, the magnitude of the electric voltage applied to generate the electric field is decided by the energy of the undesired charged particles to be suppressed. For example, when the undesired charged particles are incoming electrons which are provided by a plasma shower to neutralize the ion beam, the magnitude of the applied electric voltage should be proportional to the energy of the electrons (or plasma) ejected from the plasma shower.

Note that the electric field distribution is not limited. The invention only requires that the undesired charged particles can be pushed away from the planar Faraday cup 22. How the electric field is distributed in the inner space and how the electric field is distributed around the planar Faraday cup 22 are not limited. Indeed, when the planar Faraday cup 22 is properly insulated from the chamber wall, whether some electrons and/or some ions are moved along the electric field and then collide with the chamber wall will not affect the measured current. In other words, the electric field may be vertical to or not vertical to the surface of the planar Faraday cup 22, may have flux around the edges of the planar Faraday cup 22, may be distributed divergently, and may be any other variation.

In addition, when the planar Faraday cup 22 consists of one or more conductive plates, the voltage assembly 23 usually applied same electric voltage to all of these conductive plates. The same voltage bias over these conductive plates provides a common reference, and then the individual currents collected/measured by different conductive plates can be compared. However, when the object is monitoring the variation of the total received current, different conductive plates may be biased separated. Indeed, to quickly watch if the beam shape or beam position have changed, it is only required to monitor changes to the current collected by the planar Faraday cup 22 instead of the absolute current magnitude. For this purpose, it is not necessary to separate completely the ion beam current from other current contributions.

The details of the voltage assembly 23 are not limited. For example, the voltage assembly 23 is a small power supply embedded in a printed circuit board (PCB) and electrically coupled with the planar Faraday cup 22 via the thin wire(s). Herein, the PCB is embedded in the chamber 21. For example, the voltage assembly 23 may be a DC power supply located outside the chamber 21 and electrically coupled the planar Faraday cup 22 to a beam current measurement (such as a current meter or a Hall probe). Herein, the hardware design of the chamber 21 is very simple, because at most one or more conductive wires are required to pass through the chamber wall and electrically connected the DC power supply to the planar Faraday cup 22.

Furthermore, the planar Faraday cup 22 usually is a set of conductive plates positioned on the inner surface of the chamber wall, i.e., along the ion beam path direction, there is one and only one layer of conductive plate(s). It is convenient and economical to directly electrically couple the conductive plate(s) with the voltage assembly 23, so that the layer of conductive plate(s) can be used to receive/collect ion beam (or viewed as receive/collect incident current) and transform the applied electric voltage into the electric field inside the chamber 21 simultaneously. The advantages are clear, few hardware parts are required and then the cost is less expensive, also the conductor property of the conductive plate(s) may generate a more uniform electric field (at least a uniform electric field close to the surface of the planar Faraday cup 22). However, some undisclosed embodiments may use two layers of conductive plates along the ion beam path direction. In this approach, one layer of conductive plates is used to receive/collect the ion beam and another layer of conductive plates is used to transform the electric voltage into the electric field.

The advantage of this proposed invention is more significant for the low energy ion implantation. As briefly described above, for a low energy ion beam, owing to the space charge effect and the low velocity of ions, the beam expansion is more serious and then a significant percentage of the total beam current is at the edges of the ion beam. As usual, numerous incoming electrons usually are added into the low energy ion beam to reduce the beam expansion. By using this invention, the lost portions of the ion beam are significantly reduced because the planar Faraday cup 22 can significantly increase the area for receiving the ion beam, and the inaccuracy of the measured beam current induced by incoming electrons also can be significantly minimized by using the voltage assembly 23. The reason is simple, the secondary electrons induced by the collision between the planar Faraday cup 22, even other portions of the ion beam current measurement apparatus and/or other portions of the chamber wall, is proportional to the ion beam energy. Hence, the effect induced by the secondary electrons is more minor for the low energy ion implantation. Therefore, by properly adjusting the operation of the voltage assembly 23 to apply a negative electric voltage to the planar Faraday cup 22 for properly suppressing these incoming electrons, the measured beam current can be almost equal to the practical ion beam current.

In addition, although not shown in any figure and any described embodiment, one or more current meters may be electrically connected to the conductive plates in a one-on-one relation, so that the ion beam may be precisely and flexibly measured. On the basis of the output of the current meters, the ion beam can be interlocked when some unacceptable variations, such as larger glitches, are detected, the ion beam can be shaped by tuning the beam optics to keep the implanted dose stable, and so on.

Besides, the proposed planar Faraday cup 22 and the voltage assembly 23 may be integrated with the conventional Faraday cup. In such situation, the structure of the chamber may be only amended slightly to add the planar Faraday cup 22 in the inner portion of the chamber 21, where the voltage assembly 23 usually is located outside the chamber 21 for minimizing both potential contamination and required space inside the chamber 21. Generally, the conventional Faraday cup is a deep structure extending into the chamber wall and having an opening that faces the inner space of the chamber 21. Hence, all above embodiments may be modified slightly to include an optional non-planar Faraday cup, i.e., the conventional Faraday cup. In this situation, the planar Faraday cup 22 surrounds the opening of the non-planar Faraday cup. In other words, all above embodiments may be amended simply by replacing the above described "the intersection between the planar Faraday cup and the ion beam path" by "the opening of the non-planar Faraday cup."

Figure 3A:
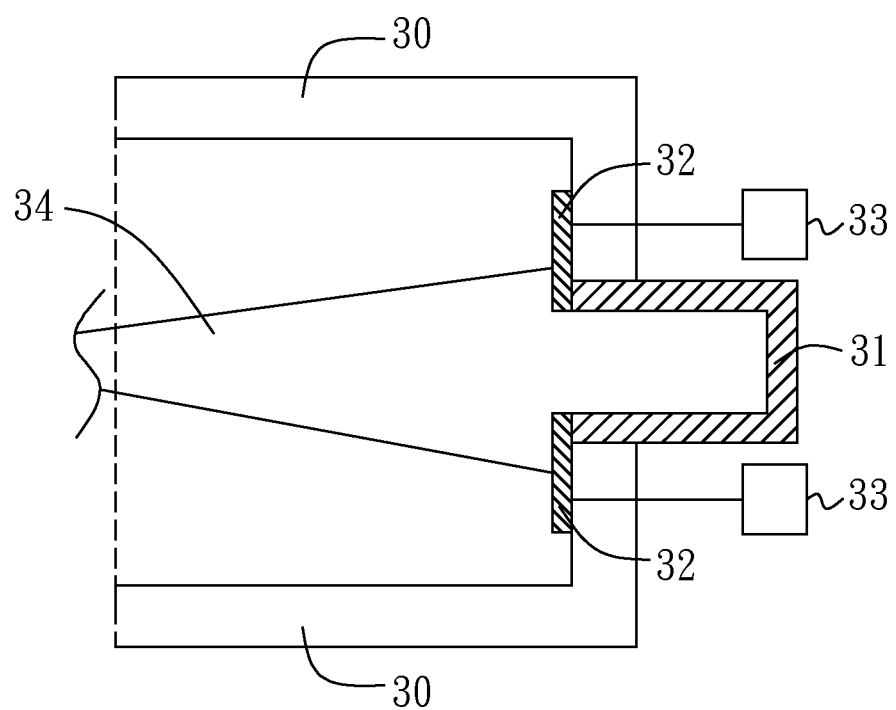
FIG. 3A and FIG. 3B are two representative schematic diagrams of one proposed ion beam current measurement apparatus according to another embodiment of the invention.
Figure 3B:
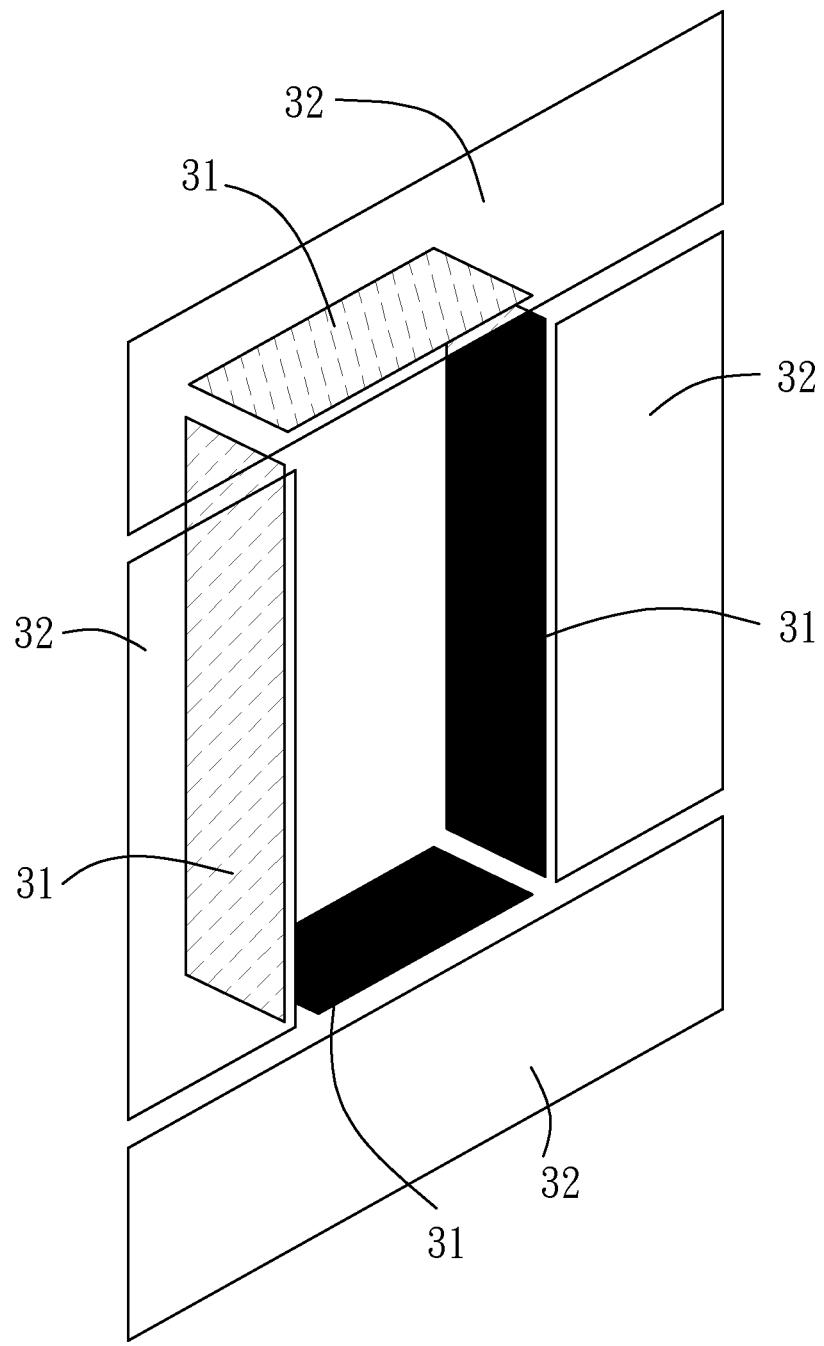

One such embodiment is an ion beam current measurement apparatus with two representative schematic diagrams, FIG. 3A and FIG. 3B. The proposed ion beam current measurement apparatus is located on a portion of a chamber wall of a chamber 30 where an ion beam 34 is directed to implant a workpiece when the workpiece is located inside the chamber 30. The proposed ion beam current measurement apparatus has at least an non-planar Faraday cup 31, a planar Faraday cup 32 and a voltage assembly 33. In short, the non-planar Faraday cup 31 is a deep structure that extends into the chamber wall and has an opening that faces an inner space of the chamber 30. More details of the non-planar Faraday cup 31 are omitted herein, because the non-planar Faraday cup 31 may be any conventional Faraday cup. Besides, the planar Faraday cup 32 surrounds the opening and faces the inner space, and may be tilted to, parallel to or absolutely parallel to an inner surface of the chamber wall. Moreover, the voltage assembly 33 is located outside the chamber 30 and electrically coupled with the planar Faraday cup 32 for generating proper electric field inside the chamber 30 and around the planar Faraday cup 32.

As shown in FIG. 3A and FIG. 3B, the planar Faraday cup 32 may significantly increase the cross-section of the ion beam current measurement apparatus for receiving the ion beam 34. Hence, to compare with the conventional Faraday cup, such embodiments may significantly increase the possibility of measuring correctly the ion beam current. Note that the details of how the planar Faraday cup 32 is configured are not limited. Different embodiments may have different variations. For example, when the size of the opening is larger, the extended distance of the planar Faraday cup 32 may be shorter for similar ion beams 34 with similar ion beam conditions (similar ion beam energy or similar deflected angle). For example, when the size of the opening is fixed, the extended distance of the planar Faraday cup 32 may be larger for ion beam 34 with lower ion beam energy or longer beam height. For example, when the beam height of the ion beam 34 is along a Y-axis and the ion beam is delivered along a Z-axis, the required extended distance of the planar Faraday cup 32 may be longer along the Y-axis but shorter along an X-axis. For example, the proposed ion beam current measurement apparatus may be divided into two or more individual conductive plates. Hence, not only the total current of the ion beam may be precisely measured, but also both the size and the direction of the ion beam may be efficiently measured.

Figure 3C:
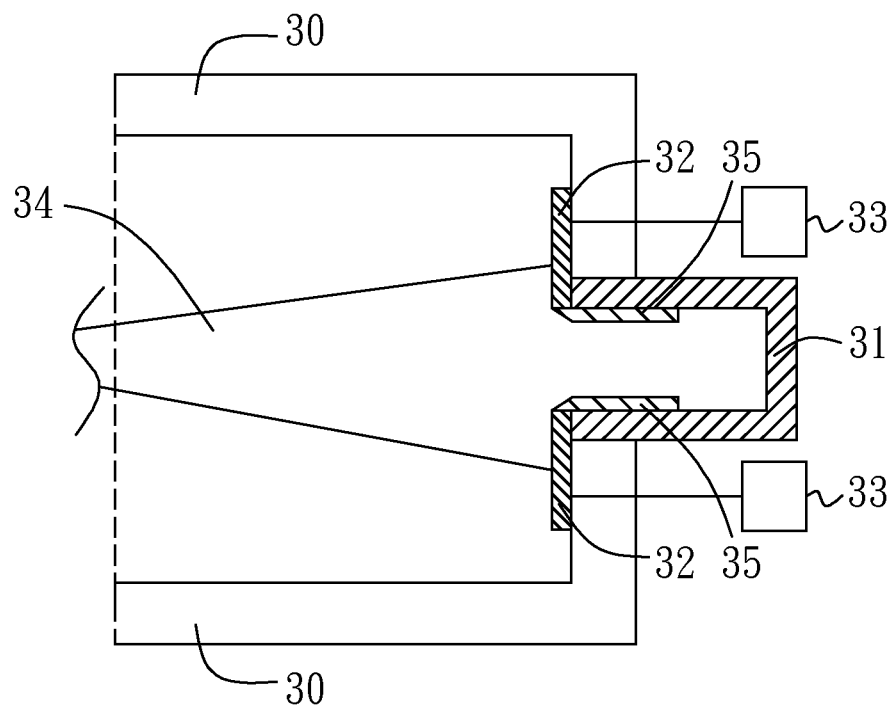
FIG. 3C is a representative schematic diagram of the proposed planar Faraday cup, the proposed non-planar Faraday cup and the proposed additional conductive plates according to another embodiment of the invention.

Furthermore, to more flexibly and precisely measure the ion beam current, one more embodiment, as shown in FIG. 3C, has one or more additional conductive plates 35 vertical to the planar Faraday cup 32 at the entrance of the opening. Herein, the additional conductive plates 35 are electrically floating and electrically connected to the planar Faraday cup 32, and may be graphite plates or other equivalent plates made by conductive material(s). Therefore, the current generated by charged particles received by the additional conductive plates 35 are incorporated with the current received by the planar Faraday cup 32. Accordingly, the proposed ion beam current measurement apparatus may receive and measure the ion beam current with more correctness and flexibility.

Of course, to monitor the distribution of the ion beam as discussed above, when the planar Faraday cup 32 is consisting of one or more conductive plates, the additional conductive plates 35 and the conductive plates are corresponded in a one-on-one relation. Moreover, the voltage assembly 33 may be electrically coupled with the additional conductive plates 35, so that the additional conductive plates 35 may only receive the desired ions. The requirement of the generated electric field is similar with the conditions discussed above and then are omitted herein.

One main advantage of these proposed ion beam current measurement apparatuses is the larger cross-section for receiving the ion beam. Usually, the hardware on the inner surface of the chamber wall is significantly less than the hardware on the outer surface of the chamber wall. Hence, the upper limitation of the size of the planar Faraday cup may be less restricted, i.e., the size of the planar Faraday cup may be significantly larger than the size of the opening of the conventional Faraday cup (i.e., the size of the opening of the non-planar Faraday cup). Therefore, the proposed ion beam current measurement apparatus may receive and measure more portions of the ion beam, even whole the ion beam, no matter how the ion beam is deflected and/or dispersed or how the ion beam is distributed. Accordingly, it is possible and practical to only use the proposed ion beam current measurement apparatus without using the profiler for further amendment.

Another main advantage of these proposed ion beam current measurement apparatuses is the small size. The planar Faraday cup may be plate-like structures (conductive plates), also the voltage assembly may be located outside the chamber and electrically coupled with the planar Faraday cup. Hence, the planar Faraday cup may be used to receive the incident ion beam and may use an electrode to transform the applied electric voltage into an electric field inside the chamber at the same time. Accordingly, the size of partial proposed ion beam measured apparatus in the inner space of the chamber wall may be reduced. To compare the prior art that uses both the planar Faraday cup and thin magnet inside the chamber, the main advantage is more significant. Besides, the optional non-planar Faraday cup is not located inside the inner space of the chamber but is in the chamber wall of the chamber (even on the outer space of the chamber). Hence, the net thickness of the proposed ion beam current measurement apparatus in the inner space of the chamber may be effectively reduced, and then the proposed ion beam current measurement apparatuses may be attached suitably on the chamber wall without any modification on the chamber wall. Furthermore, the plate-like structure of the planar Faraday cup allows the workpiece being located close or adjacent to the planar Faraday cup (i.e., located close or adjacent to the opening of the non-planar Faraday cup), so that the variation of the ion beam between the workpiece position and the proposed ion beam current measurement apparatus may be minimized. In this way, the correctness of the ion beam current measurement may be further improved.

Figure 4:
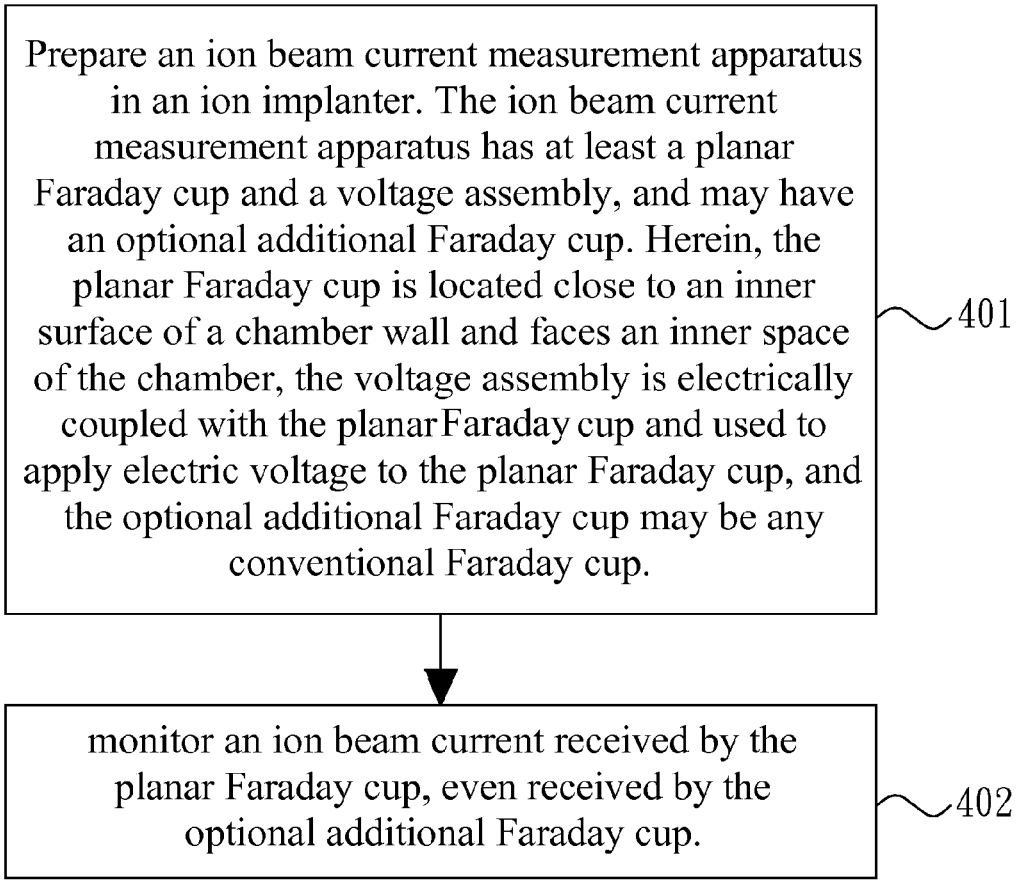
FIG. 4 is a flowchart of a method according to another embodiment of the invention.

One more embodiment, as shown in FIG. 4, is a method for measuring ion beam current. Initially, as shown in block 401, prepare an ion beam current measurement apparatus in an ion implanter. The ion beam current measurement apparatus has at least a planar Faraday cup and a voltage assembly, and may have an optional non-planar Faraday cup. Herein, the planar Faraday cup is located close or adjacent to an inner surface of a chamber wall and faces an inner space of the chamber, the voltage assembly is electrically coupled with the planar Faraday cup and used to apply electric voltage to the planar Faraday cup, and the optional non-planar Faraday cup may be any conventional Faraday cup. Then, as shown in block 402, monitor an ion beam current received by the planar Faraday cup, even received by the optional additional non-planar Faraday cup.

Reasonably, the flowchart shown in FIG. 4 is the basic operation of the ion beam measurement apparatus proposed above. Initially, prepare and turn on an ion implanter with such ion beam current measurement apparatus. Next, measure the ion beam current appeared on whole the ion beam current measurement apparatus. However, different implantations may require different ion beams. For example, to form the N-type wall of the P-type transistors may require high energy ion beam, but to form the shallow junction may require low energy ion beam. Therefore, to properly suppress only the undesired charge particles, an optional step is adjusting the electric field generated during an operation period of the ion implanter. The magnitude of the electric field may be adjusted by adjusting the power applied by the voltage assembly to the planar Faraday cup. In other words, the method may further comprise a step of adjusting the magnitude of the applied electric voltage to be proportional to the energy of the undesired charged particles to be suppressed by an electric field generated by said Faraday cup.

Further adjustments of the planar Faraday cup may be executed to reflect the possible variations of the required ion beam. Of course, it also is possible to use a fixed configuration of the planar Faraday cup that is suitable for all possible variations. For example, during a maintenance period of the ion implanter, the planar Faraday cup (or the projection of the planar Faraday cup on the inner surface) may be extended along a direction across the ion beam path from the mass analyzer to the workpiece position. For example, one or more conductive plates attached on the inner surface of the chamber wall may be added or removed during a maintenance period of the ion implanter. Herein, the extended distance, or the size of the added/removed conductive plates, is inversely proportional to a predetermined low limitation of ion beam energy. For example, during a maintenance period of the ion implanter, it is optional to adjust a number, a shape and a size of one or more conductive plates integrated as the planar Faraday cup. Hence, when required ion beam is different owing to different required implantations on the workpiece, the planar Faraday cup may be pre-adjusted to reflect the potential beam expansions and deflections during the next operation period.

In summary, these proposed embodiments and other non-disclosed embodiments may efficiently receive and measure the ion beam with beam expansion, beam deflection and/or larger beam size. Hence, the practical ion beam current may be precisely real-time measured, and then the implant dose control may be improved. Further, the size of the proposed planar Faraday cup is small, the voltage assembly may be located outside the chamber but be electrically coupled with the planar Faraday cup with electric couple mechanism (such as conductive wires), and the profiler may be skipped. Therefore, the proposed ion beam current measurement apparatus may be achieved simply without significantly modifying the chamber.

Although the present invention has been explained in relation to its preferred embodiments, it is to be understood that other modifications and variations can be made without departing from the spirit and scope of the invention as hereafter claimed.

What is claimed is:

1. An ion beam current measurement apparatus, comprising:
    a planar Faraday cup being located adjacent to an inner surface of a chamber wall and facing an inner space of a chamber;
    a voltage assembly electrically coupled with said planar Faraday cup, said voltage assembly applying electric voltage to said planar Faraday cup; and
    a non-planar Faraday cup comprising a structure that extends into said chamber wall and having an opening that faces said inner space, wherein said planar Faraday cup surrounds said opening.

2. The apparatus as set forth in claim 1, said planar Faraday cup and said chamber wall being configured according to at least one of the following:
    said planar Faraday cup having a non-zero angle with respect to said chamber wall; and
    said planar Faraday cup is parallel to said inner surface of said chamber wall.

3. The apparatus as set forth in claim 1, said planar Faraday cup comprising one or more conductive plates, wherein each said conductive plate is electrically insulated from other said conductive plates.

4. The apparatus as set forth in claim 3, both a number and a configuration of said conductive plates being adjustable, wherein said configuration includes at least a size, a shape and a position.

5. The apparatus as set forth in claim 1, a material of a surface of said planar Faraday cup being chosen from a group consisting of the following: graphite, conductive glue, and conductive film.

6. The apparatus as set forth in claim 1, said voltage assembly being located outside said chamber.

7. The apparatus as set forth in claim 3, said voltage assembly comprising one or more voltage sources that correspond to said conductive plates in a one-on-one relation.

8. The apparatus as set forth in claim 1, said voltage assembly being configured to suppress at least an incoming electron.

9. The apparatus as set forth in claim 3, further comprising one or more current meters, said current meters being electrically connected to said conductive plates in a one-on-one relation.

10. The apparatus as set forth in claim 1, said planar Faraday cup being configured according to at least one of the following:
    said planar Faraday cup covering an entire area around said opening without any gap; and
    said planar Faraday cup being extended, wherein a projection of an extended distance on said inner surface is inversely proportional to a predetermined low limitation of an ion beam energy.

11. The apparatus as set forth in claim 1, further comprising one or more conductive plates perpendicular to said planar Faraday cup at an entrance of said opening, said conductive plates being electrically connected to said planar Faraday cup.

12. The apparatus as set forth in claim 11, when said planar Faraday cup comprises one or more additional conductive plates, said additional conductive plates corresponding to said conductive plates in a one-on-one relation.

13. A method for measuring ion beam current, comprising:
    preparing an ion beam current measurement apparatus in an ion implanter, said ion beam current measurement apparatus comprising a planar Faraday cup and a voltage assembly, said planar Faraday cup being located adjacent to an inner surface of a chamber wall and facing an inner space of said chamber wall, and said voltage assembly being electrically coupled with said planar Faraday cup and used to apply electric voltage to said planar Faraday cup;
    monitoring an ion beam current appearing on said planar Faraday cup; and
    surrounding said planar Faraday cup around an opening of an non-planar Faraday cup, wherein said non-planar Faraday cup is a structure extending into said chamber wall and said opening faces said inner space.

14. The method as set forth in claim 13, further comprising adjusting the applied electric voltage during an operation period of said ion implanter so that an electric field applied by said planar Faraday cup is varied during said operation period.

15. The method as set forth in claim 13, further comprising adjusting the magnitude of the applied electric voltage to be proportional to the energy of undesired charged particles to be suppressed by an electric field generated by said planar Faraday cup.

16. The method as set forth in claim 14, further comprising extending a projection of said planar Faraday cup on said inner surface during a maintenance period of said ion implanter, wherein an extended distance is inversely proportional to a predetermined low limitation of an ion beam energy.

17. The method as set forth in claim 14, further comprising adjusting a number, a shape and a size of one or more conductive plates integrated as said planar Faraday cup during a maintenance period of said ion implanter.

18. The method as set forth in claim 13, comprising at least one of the following:
    adjusting said voltage assembly during a maintenance period of said ion implanter, wherein said adjustment ensures an electric field vertical to said inner surface in a section of said planar Faraday cup near said opening; and
    locating one or more conductive plates perpendicular to said planar Faraday cup at an entrance of said opening, said conductive plates being connected to said planar Faraday cup.

* * * * *